United States Patent
Leyendecker et al.

(10) Patent No.: US 6,869,334 B1
(45) Date of Patent: Mar. 22, 2005

(54) PROCESS FOR PRODUCING A HARD-MATERIAL-COATED COMPONENT

(75) Inventors: Antonius Leyendecker, Herzogenrath (DE); Hans-Gerd Fuss, Herzogenrath (DE); Rainer Wenke, Aachen (DE); Georg Erkens, Aachen (DE); Stefan Esser, Aachen (DE); Ingo Künzel, Aachen (DE)

(73) Assignee: Cemecon-Ceramic Metal Coatings-Dr. Ing. Antonius Leyendecker GmbH (DE)

( * ) Notice: Subject to any disclaimer, the term of this patent is extended or adjusted under 35 U.S.C. 154(b) by 289 days.

(21) Appl. No.: 09/979,724

(22) PCT Filed: May 29, 2000

(86) PCT No.: PCT/EP00/04877

§ 371 (c)(1),
(2), (4) Date: Nov. 28, 2001

(87) PCT Pub. No.: WO00/73532

PCT Pub. Date: Dec. 7, 2000

(30) Foreign Application Priority Data

May 28, 1999 (DE) .......................................... 199 24 422

(51) Int. Cl.$^7$ ................................................. B24B 1/00
(52) U.S. Cl. .............................. 451/38; 451/39; 451/40; 451/54
(58) Field of Search .............................. 451/38, 39, 40, 451/91, 102, 54

(56) References Cited

U.S. PATENT DOCUMENTS

| | | | |
|---|---|---|---|
| 4,764,434 A | * | 8/1988 | Aronsson et al. ........... 428/565 |
| 5,318,840 A | | 6/1994 | Ikeda et al. |
| 5,431,072 A | | 7/1995 | Christoffel |
| 5,762,538 A | * | 6/1998 | Shaffer ......................... 451/36 |
| 6,132,293 A | * | 10/2000 | Littecke et al. ................ 451/38 |
| 6,575,817 B2 | * | 6/2003 | Czech .......................... 451/61 |

FOREIGN PATENT DOCUMENTS

| | | |
|---|---|---|
| JP | 02 254144 | 10/1990 |
| JP | 04 028854 | 1/1992 |

OTHER PUBLICATIONS

DIN 8200, Preisgr. 8, pp 1–10, Oct. 1982.
Oberflachentechnik, "Oberflachenrauheit, Messgrossen, Zeichnungsangaben, Prufungen, Ubersicht, Stand der Normung" George Henzold, Berlin 1981.
DIN 8200, Preisgr. 8, pp 1–10, Oct. 1982 (with English Abstract).
Oberflachentechnik, "Oberflachenrauheit, Messgrossen, Zeichnungsangaben, Prufungen, Ubersicht, Stand der Normung" George Henzold, Berlin 1981 (with English Abstract).

* cited by examiner

*Primary Examiner*—Eileen P. Morgan
(74) *Attorney, Agent, or Firm*—Banner & Witcoff, Ltd.

(57) ABSTRACT

The invention relates to a process for producing a hard-material-coated component, comprising the following steps: application of a layer of hard material to the component in a PVD coating unit; and structural further processing of the outer surface of the layer of hard material, and to a component produced using the process. Particularly in the case of thick coatings or coatings with a columnar structure, such processes have a problem producing a sufficiently smooth surface on the coating. The problem is solved by the fact that for the structural further processing, the surface of the layer is blasted in a blasting device in order to improve this surface, an inorganic blasting agent with a grain size in the range from 1 μm to 100 μm and a sharp-edged grain shape being used.

20 Claims, 2 Drawing Sheets

PROCESS FOR PRODUCING A HARD-MATERIAL-COATED COMPONENT

Figure 1:
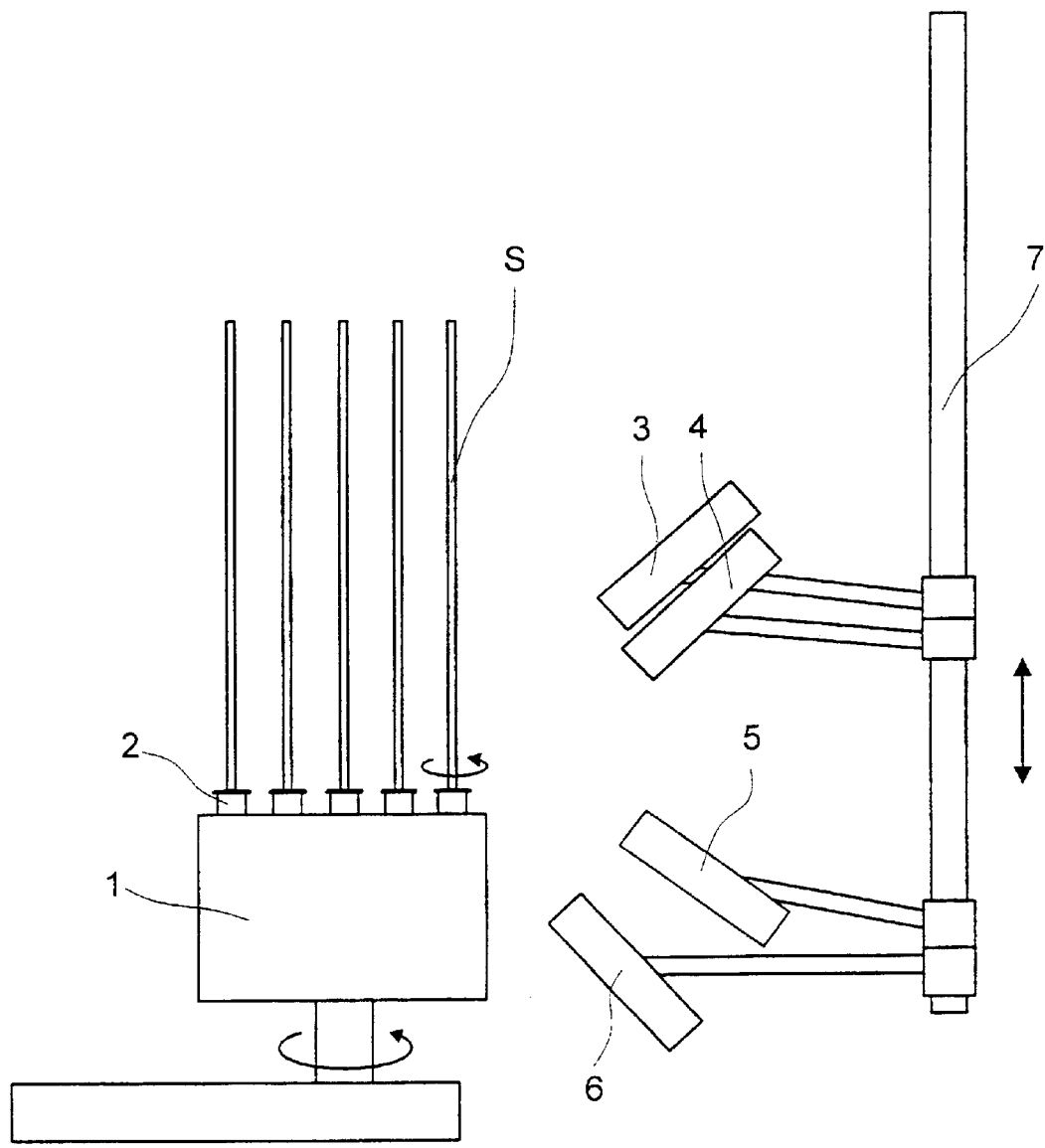

This is a U.S. National Phase Application under 35 USC 371 and applicants hereby claim benefit of priority of PCT/EP00/04877, the International Filing Date of which is Dec. 7, 2000, which was published under PCT Article 21(2) in English, and DE 199 24 422.7 having a filing date of May 28, 1999.

The invention relates to a process for producing a hard-material-coated component, comprising the following steps:
application of a layer of hard material to the component in a PVD coating unit; and
structural further processing of the outer surface of the layer of hard material.

The invention also relates to a component produced using the process, in particular a tool, which is provided with a coating of hard material and the surface of which has under-gone after-treatment.

Numerous PVD coating processes for applying a layer of hard material to a component are known in the prior art. These processes include both cathode sputtering processes and arc discharge processes. The layers of hard material applied during a PVD coating process are condensates on surfaces of component or tools of all types. The PVD layers are used, inter alia, as a functional coating, and also a decorative coating. In most applications, they improve the wear properties of the coated tools, which may, for example, be twist drills or throw-away cutting inserts. Examples of such PVD layers are nitride, oxide, carbide, carbonitride and boride compounds of a very wide range of metals. Specific examples which may be mentioned are titanium nitride (TiN), titanium aluminium nitride (TiAlN), titanium carbonitride (TiCN), titanium diboride ($TiB_2$) and aluminium oxide ($Al_2O_3$)

The components and tools which are intended to be coated may consist of sintered carbide and, in the case of tools, of tool steel.

Depending on the particular PVD coating process employed, PVD layers have a close-packed to columnar layer structure. Moreover, the technical-grade surfaces of the components to be coated range, in terms of their state/roughness, from polished to ground, spark-eroded, sintered or microblasted.

The PVD layers which are deposited on such technical-grade surfaces exhibit microtopography/microroughness in addition to roughness which originates from the surface of the coated component. These surface features are determined by process-related layer growth characteristics (e.g. droplets), layer growth flaws (pin holes/cannibals), layer imperfections (spangles, dust) and layer structure (columnar nature) These undesirable layer surface phenomena in the PVD layers become more emphasised as the thicknesses of these layers increase. This applies in particular to the columnar layer structure, which may cause microroughness and growth flaws. Consequently, an increase in the layer thickness of PVD layers is generally associated with a deterioration in the surface quality.

However, it is desirable for PVD layers which are as thick as possible to be applied to the components, since, in particular when coated tools and components are being used for machining, they provide a higher wear volume and therefore considerably increase the service life of, for example, a tool.

To improve the surface quality of PVD layers which have been grown on in columnar form, or of close-packed PVD layers, it has already been attempted to further process the coated components. This further processing has been carried out in the form of surface polishing of the PVD layer, often manually. However, such polishing is time-consuming and does not adequately ensure that the surface properties of the PVD layer are uniform.

JP 02254144 describes a method for manufacturing coated cutting tools. The cutting tools are coated with a single phase of a hard substance such as the carbide, nitride, carbonitride, oxide, oxygen carbide, oxygen nitride and oxygen carbon nitride of, for example, tungsten, using a PVD method, a CVD-method or the like. The surface of the coated layer ist subjected to shot peening treatment with 10–2000 $\mu$m diameter particles at an injection speed of 20–120 m/s and an injection angle of more than 30 degrees. The shot peening substance is iron powder, cast steel powder, WC powder or ceramic powder, each of which having a spherical grain shape.

Working on this basis, the invention is based on the object of Providing a production process for components which are provided with a PVD layer, in particular tools, which process can be used to produce PVD-coated components with a columnar structure and/or a relatively great thickness which provide a satisfactory surface structure of the PVD layer in particular for machining purposes. Moreover, it is intended to described a PVD-coated, after-treated component which has considerably improved roughness characteristics on the exposed surface of the PVD layer compared to known components, in particular tools.

With regard to the process, the object is achieved by means of a process for producing a hard-material-coated component, comprising the following steps:
application of a layer of hard material to the component in a PVD coating unit; and
structural further processing of the outer surface of the layer of hard material,
in which process In patent abstracts of Japan vol. 0.16, no. 194 (C-0938), 11 May 1992 (1992-05-11) & JP 04 028854 A (Toshiba Tungaloy Co. Ltd), 31 January 1992 (1992-01-31), a surface treatment for base material for a coated tool is described. The surface of the base material is blasted using $Al_2O_3$ as a blasting material. The blasting material, has $\leq$500 mesh grain size and serves for removing contaminent, sticking matter, binding phase etc. from base material composed of ferrous material, non-ferrous material, sintered hard alloy, cermet, ceramic sintered compact etc. A process for an after-treatment of a coated tool is not disclosed.

for the structural further processing, the surface of the layer is blasted in a blasting device in order to improve this surface, an inorganic blasting agent with a grain size in the range from 1 $\mu$m to 100 $\mu$m being used.

According to the invention, the finished coated component is blasted using an inorganic blasting agent with a very small grain size compared to conventional blasting processes. Experimental investigations have shown that the surface structure of PVD layers/coatings of a thickness of at least 2,5 $\mu$m which have been grown in columnar form is homogenized and smoothed. The same advantages also result for close-packed PVD layers, in particular even if they have a thickness of more than 4 $\mu$m. $TiB_2$ may be mentioned as an example of a material for a PVD layer which has been grown on in columnar form, while the hard material TiAlN may have a close-packed structure given by a suitable PVD coating process. In principle, however, the process can be applied to all PVD layers of hard materials to improve the surface quality of these layers, in particular to reduce their surface roughness, so that they can be used in particular for machining processes.

The blasting agent has a sharp-edged grain shape, as is the case, for example, with the blasting agents $Al_2O_3$ (crystal corundum) and SiC.

In principle, all natural inorganic or synthetic inorganic, usually solid, blasting agents which comply with the grain size and shape for the blasting agent defined above may be considered. Further examples which may be mentioned are broken stone, slag, broken glass and silica sand. The grain size of the blasting agent is preferably in a range from 1–50 μm, particularly preferably in a range from 10–15 μm.

In principle, the blasting of the PVD-coated components can be carried out in any desired way. Both shot blasting and pressure blasting are possible; pressure blasting provides very good results for improving the surfaces of the PVD layers. Compressed-air blasting, wet compressed-air blasting, slurry blasting, pressurized liquid blasting and steam blasting, as listed and explained in DIN Standard No. 8200, to which reference is expressly made, are examples of pressure blasting.

If compressed-air blasting is used in order to improve the surface of a PVD layer which has been deposited on a component, the blasting pressure behind the nozzle which is customarily used in this blasting process may be in the range from $1-10^5$ Pa preferably may be $2·10^5$ Pa.

Given a nozzle aperture cross section in the range from 4–15 mm, the distance between the nozzle(s) and the coated component(s) is preferably in the range below 200 mm.

It has proven particularly suitable for the nozzle cross section to be 11 mm and the distance between the nozzle(s) and the component(s) to be in the range from 30–100 mm.

The invention also relates to a PVD-coated, after-treated component, in particular tool, having a substrate and a layer of hard material of predetermined thickness which is applied to the substrate during a PVD process, in which component the thickness of the layer of hard material is at least 2,5 μm, preferably at least 4 μm, and the quotient of the roughness of the exposed surface of the layer of hard material before and after the after-treatment is greater than 1,2, preferably greater than 2.

A PVD-coated, after-treated component of this type has an improved surface quality compared to known components. If a tool is being used for machining, the improved surface quality leads to comparatively better entry conditions. The smoother surface of the PVD layer compared to known tools also reduces the likelihood of the coated tool sticking, a phenomenon which leads to material from the PVD layer adhering to a workpiece which is to be machined.

An improved surface quality compared to known PVD-coated components, in particular tools, is provided irrespective of the thickness of the PVD hard material layer structure which has been grown on in columnar form.

Figure 2:
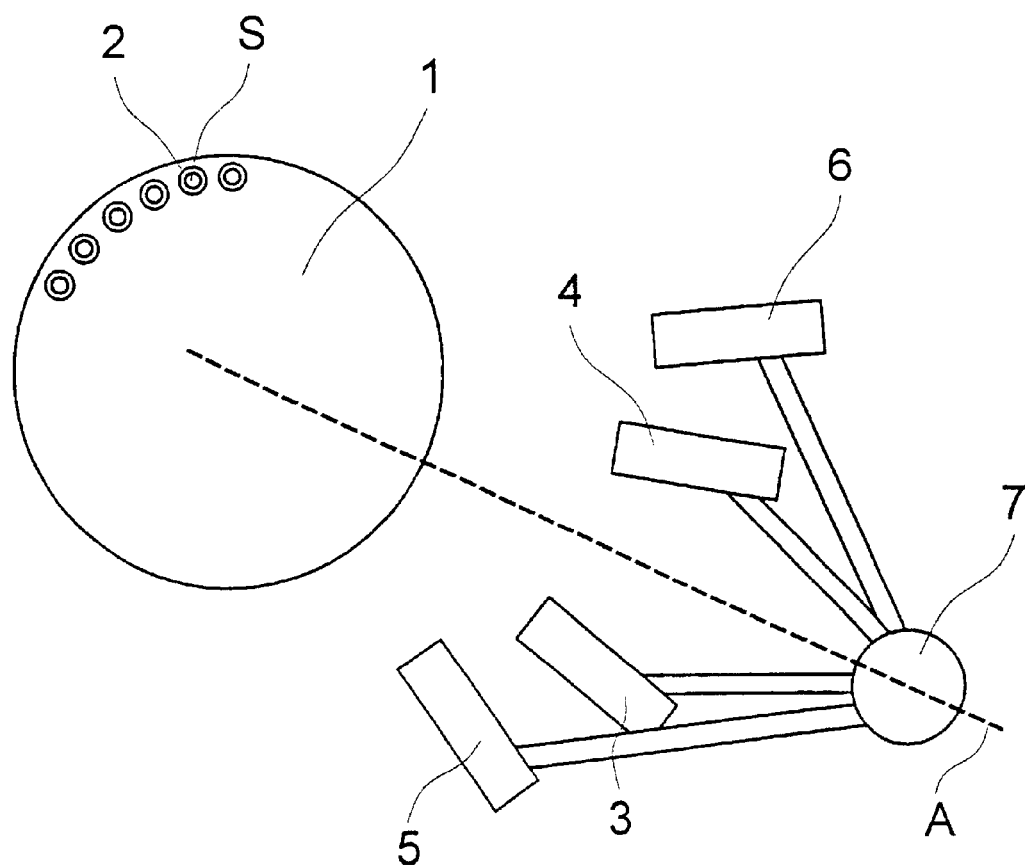

Exemplary embodiments of the invention are described in more detail below with reference to the drawings, in which:

FIG. 1 shows a diagrammatic side view of a blasting device for carrying out an after-treatment blasting process, with a plurality of blasting nozzles and a substrate holder; and FIG. 2 shows a diagrammatic plan view of the blasting device shown in FIG. 1.

FIG. 1 shows a blasting device with a substrate table 1 to which coated twist drills S are attached by means of holders 2. The holders 2 are arranged parallel to one another and run perpendicular to the surface of the substrate table 1. The substrate table 1 is rotatably mounted, while the holders 2 on the substrate table 1 are also rotatably mounted. The axes of rotation of the holders 2 and of the substrate table 1 run parallel to one another. When the blasting device is operating, therefore, the holders 2 rotate about the axis of rotation of the substrate table 1 and, at the same time, about their own axis of rotation.

A total of four nozzles 3, 4, 5, 6 is arranged at a distance from the substrate table 1. Each of the nozzles 3, 4, 5, 6 is arranged on a shaft 7, which runs parallel to the axis of rotation of the substrate table 1, by means of in each case one arm. The nozzles 3, 4, 5, 6 can be displaced along the shaft 7 and therefore parallel to the axis of rotation of the substrate table by means of a drive (not shown), specifically at a predetermined cycle frequency. The shaft 7 is sufficiently long for it to be possible to displace the nozzles 3, 4, 5, 6 over the entire height of the twist drills S. Consequently, when the blasting device is operating, the nozzles 3, 4, 5, 6 move along the twist drills S from the surface of the substrate table to the top end of the holders 2 and back, until a blasting process has finished.

The nozzles 3, 4, 5, 6 are divided into two pairs, specifically a top pair of nozzles 3, 4 and a bottom pair of nozzles 5, 6 which, as can be seen from FIG. 1 in combination with FIG. 2, are all directed at a common point on the axis of rotation of the substrate table 1.

Moreover, the nozzles 3, 4, 5, 6 are arranged at two different angles with respect to an axis of symmetry A of the blasting device which perpendicularly intersects both the axis of rotation of the substrate table and the shaft 7 on which the nozzles 3, 4, 5, 6 are arranged. The nozzle outlet axes of the nozzles 3, 4 form a smaller horizontal angle with the axis of symmetry A than do the nozzle outlet axes of the nozzles 5, 6. The nozzles 3 and 5 are therefore arranged symmetrically to the nozzles 4 and 6, respectively, with respect to the axis of symmetry A.

The angle of one of the nozzles 3, 4, 5, 6 with respect to the substrate table 1 can be set in the following way. The horizontal directional component of the relevant nozzle is established by means of a protractor. The nozzle is attached to its arm in such a way that its angle can be set. This setting is carried out as desired. The vertical angle of the nozzle may be 45° with respect to the protractor, specifically in a vertical plane which intersects the protractor.

The distance of the nozzle outlet, end from the edge of the substrate table 1 can also be fixed by local adjustment of the nozzle on its arm.

The angle of the nozzles 3, 4, 5, 6 to the surface of the substrate table 1 may be between 0 and 90°, preferably between 0 and 45°. The lifting speed of the blasting nozzles 3, 4, 5, 6 may be in a range from 0 to 500 mm/min, preferably between 50 and 100 mm/min. The rotational speed of the holders 2 about the axis of rotation of the substrate table 1 may be in a range from 0 to 100 rpm, but is Preferably 70 rpm.

Examples of sets of parameters for carrying out a blasting process are given below:

a) PVD layer: TiAlN (close-packed structure)
  Blasting agent: $Al_2O_3$ (crystal corundum)
  Grain size of the blasting agent: 12.3±1.0 μm/F500
  Blasting pressure: $2·10^5$ Pa
  Ratio of lifting speed of the nozzles to rotational speed of the substrate table: 0.002
  Blasting duration: 900–1800 seconds
  After the end of the blasting process, a surface roughness of 1.84 $R_z$ was determined for the TiAlN layer, while the surface roughness $R_z$ of this layer prior to the blasting treatment was 2.67.

b) PVD layer: TiAlN (close-packed structure)
  Layer thickness: 4.7 μm
  Substrate roughness $R_z$ before coating: 0.67 (grinded)

Layer roughness $R_z$ prior to blasting treatment: 3.01
Layer roughness $R_z$ after blasting treatment: 1.00 (layer roughness prior to blasting treatment)/(layer roughness after blasting treatment):3.01
Blasting duration: 200–1200 seconds.
Blasting agent, grain size of the blasting agent, blasting pressure as in example a)

c) PVD layer: TiAlN (close-packed structure)
Layer thickness: 4.7 µm
Substrate roughness $R_z$ before coating: 0.07 (polished)
Layer roughness $R_z$ prior to blasting treatment: 2.21
Layer roughness $R_z$ after blasting treatment: 0.71 (layer roughness prior to blasting treatment)/(layer roughness after blasting treatment): 3.11
Blasting duration: 200–1200 seconds.
Blasting agent, grain size of the blasting agent, blasting pressure as in example a).

d) PVD layer: TiAlN (close-packed structure)
Layer thickness: 4.7 µm
Substrate roughness $R_z$ before coating: 0.87 (microblasted)
Layer roughness $R_z$ prior to blasting treatment: 3.48
Layer roughness $R_z$ after blasting treatment: 1.40 (layer roughness prior to blasting treatment)/(layer roughness after blasting treatment): 2.49 Blasting duration: 200–1200 seconds.
Blasting agent, grain size of the blasting agent, blasting pressure as in example a).

e) PVD layer: $TiB_2$ (columnar structure)
Layer thickness: 2.8 µm
Substrate roughness $R_z$ before coating: 0.67 (grinded)
Layer roughness $R_z$ prior to blasting treatment: 1.37
Layer roughness $R_z$ after blasting treatment: 0.81 (layer roughness prior to blasting treatment)/(layer roughness after blasting treatment): 1.70
Blasting duration: 300–600 seconds.
Blasting agent, grain size of the blasting agent, blasting pressure as in example a).

f) PVD layer: $TiB_2$ (columnar structure)
Layer thickness: 2.8 µm
Substrate roughness $R_z$ before coating: 0.07 (polished)
Layer roughness $R_z$ prior to blasting treatment: 0.84
Layer roughness $R_z$ after blasting treatment: 0.47 (layer roughness prior to blasting treatment)/(layer roughness after blasting treatment) : 1.81
Blasting duration: 300–600 seconds.
Blasting agent, grain size of the blasting agent, blasting pressure as in example a).

g) PVD layer: $TiB_2$ (columnar structure)
Layer thickness: 2.8 µm
Substrate roughness $R_z$ before coating: 0.87 (microblasted)
Layer roughness $R_z$ prior to blasting treatment: 1.01
Layer roughness $R_z$ after blasting treatment: 0.82 (layer roughness prior to blasting treatment)/(layer roughness after blasting treatment): 1.23
Blasting duration: 300–600 seconds.
Blasting agent, grain size of the blasting agent, blasting pressure as in example a)

h) PVD layer: TiAlN (close-packed structure)
Layer thickness: 7.6 µm
Substrate roughness $R_z$ before coating: 0.67 (grinded)
Layer roughness $R_z$ prior to blasting treatment: 2.40
Layer roughness $R_z$ after blasting treatment: 1.52 (layer roughness prior to blasting treatment)/(layer roughness after blasting treatment): 1.58
Blasting duration: 900–1800 seconds.
Blasting agent, grain size of the blasting agent, blasting pressure as in example a).

i) PVD layer: TiAlN (close-packed structure)
Layer thickness: 7.6 µm
Substrate roughness $R_z$ before coating: 0.07 (polished)
Layer roughness $R_2$ prior to blasting treatment: 2.82
Layer roughness $R_z$ after blasting treatment: 1.23 (layer roughness prior to blasting treatment)/(layer roughness after blasting treatment): 2.30
Blasting duration: 900–1800 seconds.
Blasting agent, grain size of the blasting agent, blasting pressure as in example a).

j) PVD layer: TiAlN (close-packed structure)
Layer thickness: 7.6 µm
Substrate roughness $R_z$ before coating: 0.87 (microblasted)
Layer roughness $R_z$ prior to blasting treatment: 2.65
Layer roughness $R_z$ after blasting treatment: 1.79 (layer roughness prior to blasting treatment)/(layer roughness after blasting treatment): 1.48
Blasting duration: 900–1800 seconds.
Blasting agent, grain size of the blasting agent, blasting pressure as in example a).

The Rz values in example a) are average values. The Rz values in examples b) to j) are each average values on the basis of two samples with three roughness measurements per sample.

The above process parameters may differ for other PVD layers which have been applied to components or tools. In particular, the values are partly determined by the intended applications of the coated components or tools, i.e. the particular application determines the blasting after-treatment required.

What is claimed is:

1. Process for producing a hard-material-coated component, comprising the following steps: applying a layer of hard material to a component in a PVD coating unit; blasting a surface of the hard material layer with an inorganic blasting agent having a sharp-edged grain shape in a blasting device in order to smooth said surface, said inorganic blasting agent having a grain size in a range from 1 µm to 100 µm.

2. Process according to claim 1, wherein the blasting agent used includes $Al_2O_3$ or SiC.

3. Process according to claim 1, wherein the grain size of the blasting agent is in a range from 1 to 50 µm.

4. Process according to claim 1, wherein the blasting step comprises compressed-air blasting.

5. Process according to claim 1, wherein the blasting step is conducted at a blasting pressure in a range from 1 to $10 \cdot 10^5$ Pa.

6. Process according to claim 5, wherein the blasting pressure is $2 \cdot 10^5$ Pa.

7. Process according to claim 1, wherein said blasting device comprises at least one nozzle for projecting said blasting agent, at least one of said nozzle comprises a nozzle aperture having a cross section in a range from 4 to 15 mm, and a distance between said at least one nozzle and the component is less than 200 mm.

8. Processing according to claim 7, wherein said at least one of said nozzles has a cross section of 11 mm, and the distance between the at least one nozzle and the component is in a range from 30 to 100 mm.

9. Process according to claim 2, wherein the grain size of the blasting agent is in a range from 1 to 50 µm.

10. Process according to claim 2, wherein the blasting step comprises compressed-air blasting.

11. Process according to claim 3, wherein the blasting step comprises compressed-air blasting.

12. Process according to claim 4, wherein the blasting step is conducted at a blasting pressure in a range from 1 to $10 \cdot 10^5$ Pa.

13. Process according to claim 10, wherein the blasting step is conducted at a blasting pressure in a range from 1 to $10 \cdot 10^5$ Pa.

14. Process according to claim 11, wherein the blasting step is conducted at a blasting pressure in a range from 1 to $10 \cdot 10^5$ Pa.

15. Process according to claim 2, wherein said blasting device comprises at least one nozzle for projecting said blasting agent, at least one of said nozzle comprises a nozzle aperture having a cross section in a range from 4 to 15 mm, and a distance between said at least one nozzle and the component is less than 200 mm.

16. Process according to claim 3, wherein said blasting device comprises at least one nozzle for projecting said blasting agent, at least one of said nozzle comprises a nozzle aperture having a cross section in a range from 4 to 15 mm, and a distance between said at least one nozzle and the component is less than 200 mm.

17. Process according to claim 4, wherein said blasting device comprises at least one nozzle for projecting said blasting agent, at least one of said nozzle comprises a nozzle aperture having a cross section in a range from 4 to 15 mm, and a distance between said at least one nozzle and the component is less than 200 mm.

18. Process according to claim 1, wherein said blasting step comprises pressurized liquid blasting.

19. Process for producing a hard-material-coated component, comprising the steps of applying a layer of hard material to a component in a PVD coating unit, and blasting a surface of the hard material layer with an inorganic blasting agent having a sharp-edged grain shape in order to smooth said surface, wherein said inorganic blasting agent has a grain size in a range from 1 $\mu$m to 100 $\mu$m, a thickness of said layer of hard material is at least 2.5 $\mu$m, and a coefficient of roughness, measured as $R_z$, of said surface of said layer of hard material before and after the blasting step is greater than 1.2.

20. Process according to claim 19, wherein said coefficient is greater than 2.0.

* * * * *